(12) United States Patent
Li et al.

(10) Patent No.: US 7,113,018 B2
(45) Date of Patent: Sep. 26, 2006

(54) HIGH VOLTAGE TOLERANT I/O CIRCUIT USING NATIVE NMOS TRANSISTOR FOR IMPROVED PERFORMANCE

(75) Inventors: Kuo-Tsai Li, San Jose, CA (US); Chi-Chiang Lin, Santa Clara, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 27 days.

(21) Appl. No.: 10/978,019

(22) Filed: Oct. 28, 2004

(65) Prior Publication Data

US 2006/0091917 A1    May 4, 2006

(51) Int. Cl.
*H03L 5/00* (2006.01)
(52) U.S. Cl. .......................... 327/333; 327/365; 326/62
(58) Field of Classification Search ................ 327/333, 327/365, 374; 326/62
See application file for complete search history.

(56) References Cited

U.S. PATENT DOCUMENTS

| | | | | |
|---|---|---|---|---|
| 5,341,334 A | * | 8/1994 | Maruyama | 365/189.11 |
| 5,397,941 A | * | 3/1995 | Merrill | 326/68 |
| 5,418,476 A | | 5/1995 | Strauss | 326/58 |
| 5,422,592 A | | 6/1995 | Asahina | 327/427 |
| 5,424,659 A | | 6/1995 | Stephens et al. | 326/81 |
| 5,537,059 A | | 7/1996 | Asahina | 326/81 |
| 5,742,183 A | * | 4/1998 | Kuroda | 326/81 |
| 5,907,249 A | | 5/1999 | Hsia et al. | 326/81 |
| 5,910,392 A | | 6/1999 | Nozaki et al. | 430/270.1 |
| 5,973,511 A | | 10/1999 | Hsia et al. | 326/81 |
| 6,064,251 A | * | 5/2000 | Park | 327/536 |
| 6,175,952 B1 | * | 1/2001 | Patel et al. | 716/18 |
| 6,255,850 B1 | * | 7/2001 | Turner | 326/81 |
| 6,333,663 B1 | | 12/2001 | Lee | 327/333 |
| 6,483,386 B1 | * | 11/2002 | Cress et al. | 330/298 |
| 6,563,367 B1 | * | 5/2003 | Lee | 327/390 |
| 6,608,515 B1 | * | 8/2003 | Taheri | 327/333 |
| 6,615,301 B1 | | 9/2003 | Lee et al. | 710/106 |
| 6,784,700 B1 | * | 8/2004 | Hunt et al. | 327/108 |

OTHER PUBLICATIONS

Annema, A. et al., "5.5-V I/O in a 2.5-V 0.25- μm CMOS Technology", IEEE Journal of Solid-State Circuits, vol. 36, No. 3, pp. 528-538 (2001).

Pelgrom, M. et al., "A 3/5 V Compatible I/O Buffer", IEEE Journal of Solid-State Circuits, vol. 30, No. 7, pp. 823-825 (1995).

(Continued)

*Primary Examiner*—Kenneth B. Wells
(74) *Attorney, Agent, or Firm*—Duane Morris LLP

(57) ABSTRACT

An I/O circuit between a low voltage circuit and a high voltage circuit includes a switching device, a native device and a gate control logic circuit. The switching device provides an output signal to the high voltage circuit in response to a data input signal received from the low voltage circuit. The native device passes the data input signal to control an on or off state of the switching device. The gate control logic circuit operates in an output disabled mode and an output enabled mode. In the output disabled mode, the gate control logic circuit disables the native device for preventing a leakage current passing therethrough. In the output enabled mode, the gate control logic circuit enables the native device to pass the data input signal through without a substantial voltage drop, thereby enhancing a switching speed of the switching device.

21 Claims, 6 Drawing Sheets

OTHER PUBLICATIONS

Takahashi, M., et al., "3.3V-5V Compatible I/O Circuit without Thick Gate Oxide", IEEE 1992 Custom Integrated Circuits Conference, pp. 23-3-1-23.3.4 (1992).

Ueda, M., et al., "A 3.3V ASIC for Mixed Voltage Applications With Shut Down Mode", IEEE 1993 Custom Integrated Circuits Conference, pp. 25.5.1-25.5.4 (1993).

* cited by examiner

HIGH VOLTAGE TOLERANT I/O CIRCUIT USING NATIVE NMOS TRANSISTOR FOR IMPROVED PERFORMANCE

BACKGROUND

The present invention relates generally to a high voltage tolerant I/O circuit, and more particularly to an I/O circuit using a native NMOS transistor that improves the I/O circuit's performance.

As the semiconductor technology develops, an integrated circuit often contains some devices operating at a high voltage level and other devices operating at a low voltage level. The low voltage devices may not tolerate a high voltage signal. Device failures happen frequently, when the low voltage devices operate with the high voltage signal. In order to protect the low voltage devices from the high voltage signals, the integrated circuit often includes an I/O circuit as an interface between the low voltage devices and the high voltage devices. The I/O circuit allows the low voltage devices to communicate with the high voltage devices, while protecting the low voltage devices from the high voltage signals.

One conventional approach of designing the I/O circuit has been focused on the structure of individual devices in the I/O circuit. For example, the conventional approach has used a dual-oxide structure for low voltage devices interfacing with high voltage devices. The thickened oxide helps a low voltage device sustain a higher voltage. However, this approach has some problems. The dual-oxide structure complicates the manufacturing processes because its manufacturing process may not be compatible with those for manufacturing ordinary devices. This results in a longer development cycle time and additional costs.

Another conventional approach to the I/O circuit takes circuit designs into account. One type of the I/O circuit is a circuit interfacing between a high voltage circuit and a low voltage circuit. The I/O circuit is composed of low voltage devices that tolerate high voltage inputs, and output signals at a low voltage level. Such I/O circuit often operates in a three-state mode wherein the I/O circuit would be placed in one of the three states: 1) asserting a low voltage logic "1" to a pad connected to the high voltage circuit; 2) asserting a logic "0" to the pad; and 3) asserting neither "1" nor "0" to the pad so that the low voltage circuit and the high voltage circuit can operate at their own voltage levels without interference therebetween.

Switching devices are used to switch the I/O circuit among the three states. The switching devices are often a set of correlated PMOS and NMOS transistors. The performance of the I/O circuit greatly depends on the switching speed of those switching devices when the I/O circuit operates in the three state mode. The greater the switching speed, the better the performance of the I/O circuit. Conventionally, the switching speed of those switching devices are much less than satisfactory. For example, a PMOS transistor in a conventional I/O circuit requires 3.3 V to completely turn it off. Due to the I/O circuit's limits, the circuit initially charges the gate of the PMOS to a voltage level less than 3.3 V, such as 2.6 V. Then the voltage level of the gate would be slowly raised up to 3.3 V. The slow charging process results in a slow switching speed of the PMOS transistor. Many failures caused by the slow switching speed have been found when the I/O circuit operates at a clock speed higher than 100 MHz. This poses a bottleneck on the I/O circuit's performance.

What is needed is an I/O circuit that has a faster switching speed when it operates in a three state mode in order to improve its performance.

SUMMARY

This invention discloses a switch module interfacing between a low voltage circuit and a high voltage circuit. A switching device is used for providing an output signal to the high voltage circuit in response to a data input signal received from the low voltage circuit. A native device is coupled between the switching device and the data input signal for passing the data input signal to control an on or off state of the switching device. The switch module also includes a gate control logic circuit capable of operating in an output disabled mode and an output enabled mode. In the output disabled mode, the gate control logic circuit disables the native device for preventing a leakage current passing therethrough. In the output enabled mode, the gate control logic circuit enables the native device to pass the data input signal through without a substantial voltage drop, thereby enhancing a switching speed of the switching device.

The construction and method of operation of the invention, however, together with additional objects and advantages thereof will be best understood from the following description of specific embodiments when read in connection with the accompanying drawings.

DESCRIPTION

This invention presents a high voltage tolerant I/O circuit coupled between a low voltage circuit and a high voltage circuit. The I/O circuit has a faster switching speed when it operates in a three state mode. A set of switching devices are used for placing the I/O circuit in an output enabled mode, in which the I/O circuit outputs logic "1s" and "0 s" to the high voltage circuit. The switching devices are also capable of placing the I/O circuit in an output disabled mode, in which the low voltage circuit and high voltage circuit operate at their own voltage level without interfering with one another. A native device is provided to quickly switch the switching devices by speeding up the charging rate of the same. A Gate Control Logic (GCL) circuit is used to ensure that no high voltage signals penetrate the I/O circuit to interfere with the low voltage circuit. As such, a higher performance of the I/O circuit is achieved.

Figure 1:
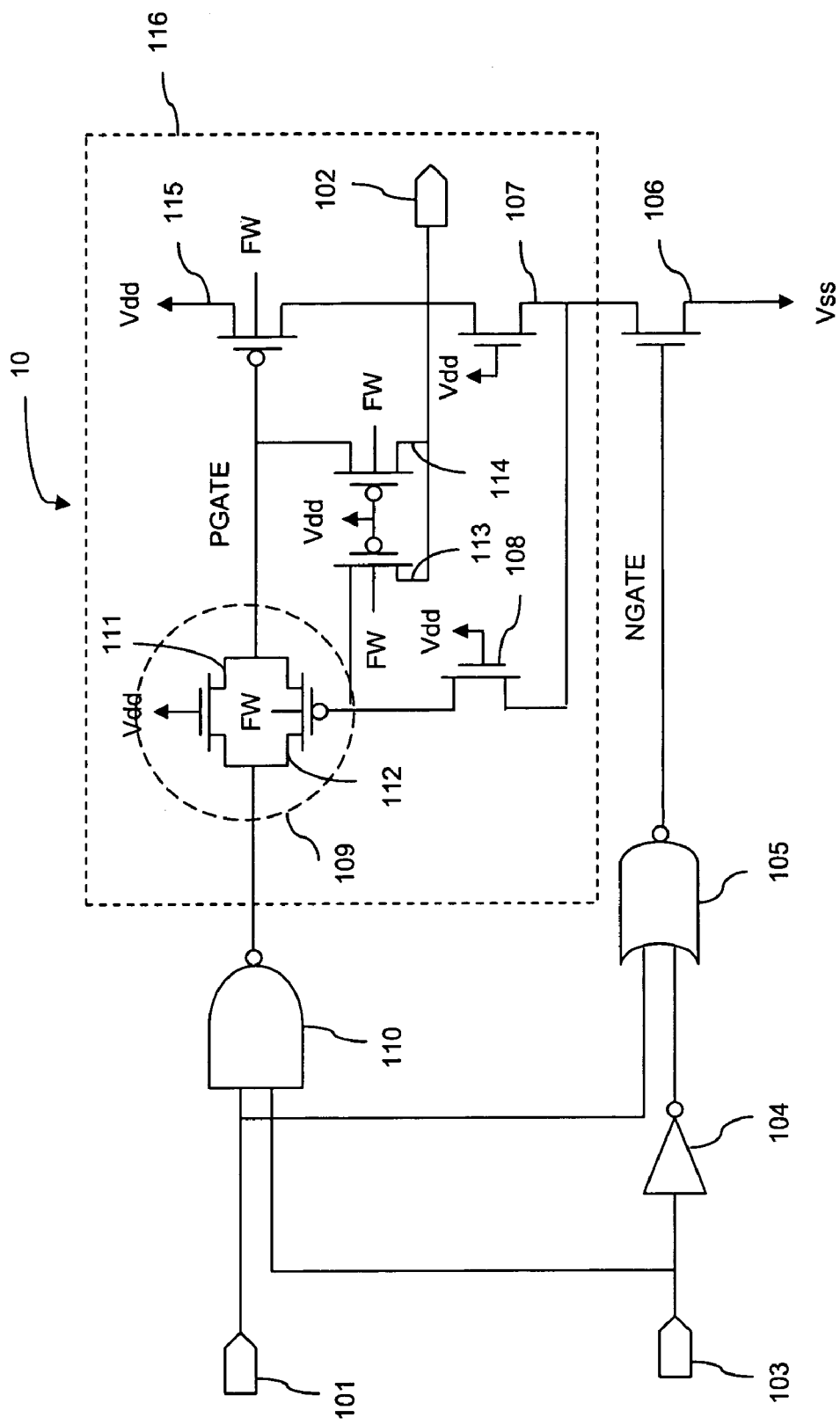
FIG. 1 schematically illustrates a conventional I/O circuit.

FIG. 1 illustrates a conventional I/O circuit 10 that operates in a three-state mode. A data input terminal 101 connects the I/O circuit 10 to a low voltage circuit (not shown in this figure). A pad 102 connects the I/O circuit 10 to a high voltage circuit (not shown in this figure). An output enable signal is sent into the I/O circuit 10 via an output enable terminal 103 for placing the I/O circuit in an output enabled mode or an output disabled mode.

An inverter 104 is connected to the output enable terminal 103. A NOR gate 105 connects the inverter 104 and the data input terminal 101 to the gate of a NMOS transistor 106. The source of the NMOS transistor 106 is connected to ground and the drain is connected to NMOS transistors 107 and 108. The drain of the NMOS transistor 107 is connected to the pad 102 and the gate is connected to a power supply Vdd. The source of the NMOS transistors 108 is connected to a voltage isolating circuit 109 and the gate is connected to Vdd.

A NAND gate 110 connects the data input terminal 101 and the output enable terminal 103 to the voltage isolating circuit 109. The voltage isolating circuit 109 includes a NMOS transistor 111 and a PMOS transistor 112 connected with one another in a source-to-drain manner. The gate of the NMOS transistor 111 is connected to Vdd. The gate of the PMOS transistor 112 is connected to the source of the NMOS transistor 108, and its well is floating. The gate of the PMOS transistor 112 is also connected to the drain of a PMOS transistor 113, whose source is connected to a PMOS transistor 114 and to the pad 102. The PMOS transistor 114 is connected to the voltage isolating circuit 109 and the gate of a PMOS 115, which is connected between the pad 102 and Vdd. The wells of the PMOS transistors 113, 114 and 115 are floating.

In an output enabled mode where the data input terminal 101 asserts a logic "1" or "0" to the pad 102, an output enable signal representing a logic "1" is input via the output enable terminal 103 into the I/O circuit 10. The inverter 104 inverts the output enable signal from "1" to "0." When a logic "1" is input from the data input terminal 101, the signal on wire NGATE will be "0" and the NMOS transistor 106 will be turned off. In the mean time, the signal output from the NAND gate will be "0." Since the NMOS transistor 111 is turned on by Vdd, the signal on wire PGATE will be "0." As a result, the PMOS transistor 115 is turned on, and Vdd is output from the pad 102 as a logic "1." When a logic "0" is input from the data input terminal 101, the NAND gate 110 will output a logic "1" to turn off the PMOS transistor 115. In the mean time, the NOR gate 105 receives a logic "0" from the data input terminal 101 and a logic "0" from the inverter 104. The output voltage on wire NGATE will be a logic "1" and the NMOS transistor 106 will be turned on. Since the NMOS transistor 107 is always on, the pad 102 is connected to ground and a logic "0" will be output therefrom.

One problem of the conventional I/O circuit 10 is that the switching speed of the PMOS transistor 115 is too slow. When a logic "1" having a voltage Vdd, is input into the voltage isolating circuit 109 to turn off the PMOS transistor 115, the PMOS transistor 112 is off, because its gate is electrically connected to Vdd via the NMOS transistors 108 and 107 and the PMOS transistor 115. When Vdd is input into the voltage isolating circuit 109, only Vdd–Vt would be coupled on wire PGATE, where Vt is the threshold voltage of the NMOS transistor 111. At this point, the PMOS transistor 115 is turned off slowly and the PMOS transistor 112 is turned on gradually. This enables more voltage to be coupled on wire PGATE until it reaches Vdd and the PMOS transistor 115 is completely turned off. The time needed for completely turning off the PMOS transistor 115 represents a limit on the performance of the I/O circuit 10. This poses a bottleneck on the clock frequency of the data input from the data input terminal 101.

Figure 2:
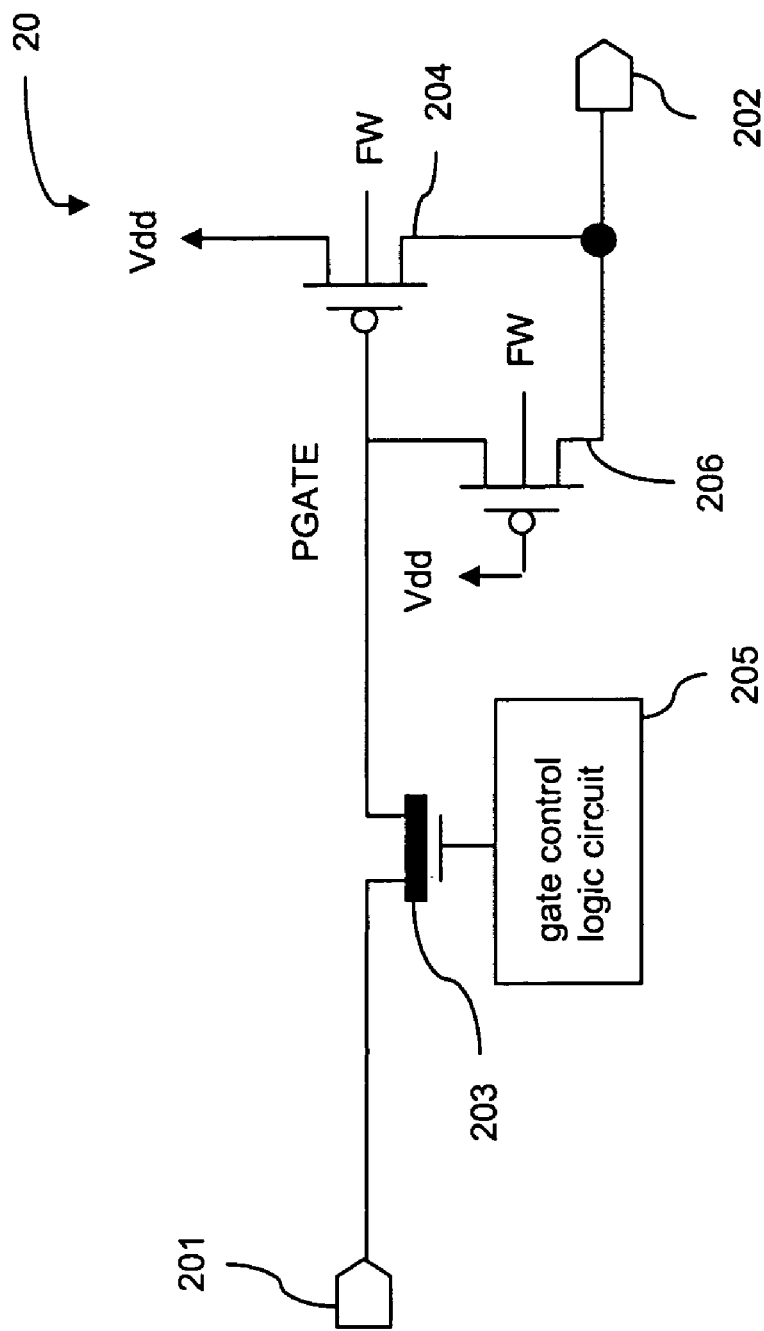
FIG. 2 schematically illustrates a switch module of a high voltage tolerant I/O circuit according to one embodiment of the present invention.

FIG. 2 illustrates a switch module 20 of a high voltage tolerant I/O circuit, according to one embodiment of the invention. The switch module 20 is an improvement of the circuit module 116 of the conventional I/O circuit as shown in FIG. 1. A first terminal 201 connects the switch module 20 to a low voltage circuit via an I/O pre-logic circuit (not shown in this figure). A pad 202 connects the switch module 20 to a high voltage circuit (not shown in this figure). A native device 203, which is a zero-volt threshold voltage NMOS transistor, connects the first terminal 201 to the gate of a switching device 204, such as a PMOS transistor. The gate of the native device 203 is controlled by a GCL circuit 205. The source of the PMOS transistor 204 is connected to Vdd, and the drain is connected to the pad 202. A PMOS transistor 206 is connected between the pad 202 and wire PGATE that connects the native device 203 to the gate of the PMOS transistor 204. The gate of the PMOS transistor 206 is connected to Vdd. The wells of the PMOS transistors 204 and 206 are floating.

The switch module 20 may be implemented as a part of a global I/O circuit. The global I/O circuit constantly transmits input signals from the first terminal 201 to the pad 202. When the input signal is at a relatively high voltage, it represents a logic "1." When the input signal is at a relatively low voltage, it represents a logic "0." For the purposes of description, in this embodiment, a voltage Vdd represents a logic "1" and a voltage 0.0 V represents a logic "0."

In an output enabled mode, input signals are transmitted to the first terminal 201. The GCL circuit 205 applies a voltage no smaller than Vdd to the gate of the native device 203 for turning on the same. When an input signal having a 0.0 V is input from the first terminal 201, the voltage level on wire PGATE is 0.0 V and the PMOS transistor 204 is turned on, such that a voltage Vdd is output to the pad 202 via the PMOS transistor 204. When an input signal having a voltage Vdd is input from the first terminal 201, the voltage level on wire PGATE will be raised to Vdd immediately because the threshold voltage of the native device 203 is 0.0 V. Thus, the PMOS transistor 204 is completely turned off without any delay. For example, assuming Vdd is 3.3 V, in an output enabled mode, the GCL circuit 205 applies a 3.3 V to the gate of the native device 203. When an input signal having a voltage level 3.3 V is input from the first terminal 201, the voltage level on wire PGATE will be raised to 3.3 V immediately. Again, this is because the threshold voltage of the native device 203 is 0.0 V.

The disclosed switch module 20 has an advantage of speeding up the switching speed of the PMOS transistor 204. The voltage of the input signal can completely pass through the native device 203 to wire PGATE without any delay. This removes the bottleneck on the allowable clock frequency imposed by conventional I/O circuits. As such, the performance of the switch module 20 is improved.

In an output disabled mode where the low voltage circuit and the high voltage circuit are operating at their own voltage levels, the challenge for the switch module 20 is to keep high voltage and low voltage signals from interfering with one another. The first terminal 201 is at a voltage level of Vdd and the pad 202 is at a voltage level of Vpad, where Vpad is greater than Vdd. The source of the PMOS transistor 206 is connected to the pad 202 that has a voltage Vpad. Because Vpad is greater than Vdd, the voltage difference between the gate and source of the PMOS transistor 206 is smaller than 0.0 V and it conducts. The voltage level on wire PGATE will be Vpad. Since the first terminal 201 is at Vdd, it is desirable to turn off the native device 203 to prevent Vpad from interfering with Vdd.

In such mode, the GCL circuit 205 outputs a bias Vdd–Vmargin to the gate of the native device 203. The voltage difference between the gate and source of the native device 203 is –Vmargin, which is smaller than zero. Thus, the native device 203 would be completely tuned off to prevent Vpad from interfering with Vdd. As such, no leakage of current would occur between wire PGATE and the first terminal 201. For example, Vpad is 5.0 V, Vmargin is 0.7 V and Vdd remains 3.3 V. In the output disabled mode, the voltage on PGATE is 5.0 V, the gate voltage of the native device 203 is 2.6 V (3.3 V–0.7 V), and the source voltage of the native device 203 is 3.3 V. The voltage difference between the gate and source is –0.7 V, so that the native device 203 is turned off. As such, the first terminal 201 is protected from interference by the 5.0 V voltage on wire PGATE.

Figure 3:
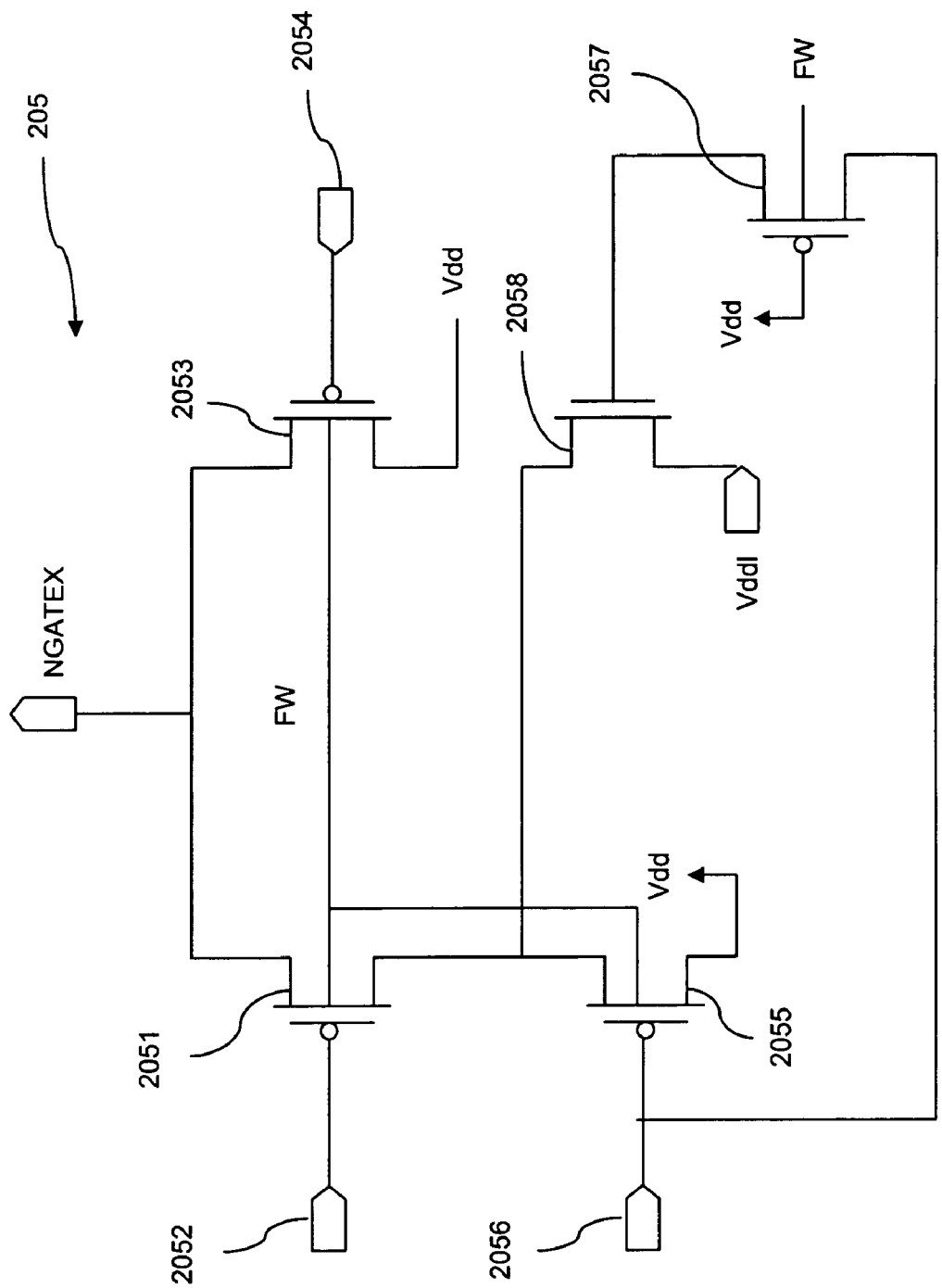
FIG. 3 schematically illustrates a gate control logic circuit in the high voltage tolerant I/O circuit according to one embodiment of the present invention.

The GCL circuit 205 can be any logic circuit that outputs Vdd in an output enabled mode and Vdd–Vmargin in an output disabled mode. FIG. 3 illustrates the GCL circuit 205 in detail according to one embodiment of the present invention. An output enable signal is applied to a gate of a PMOS transistor 2051 via an output enable terminal 2052. In a like manner, a complement output enable signal is applied to a gate of a PMOS transistor 2053 via a complement output enable terminal 2054. The drains of the PMOS transistors 2051 and 2053 are connected to wire NGATEX that is further connected to the gate of the native device 203 (see FIG. 2). The source of the PMOS transistor 2053 is connected to Vdd and its well is floating.

The source of the PMOS transistor 2051 is connected to the drain of a PMOS transistor 2055, whose source is connected to Vdd. The wells of the PMOS transistors 2051 and 2055 are floating. The gate of the PMOS transistor 2055 is connected to a pad 2056, which is also connected to a source of a PMOS transistor 2057. The gate of the PMOS transistor 2057 is connected to Vdd and its drain is connected to a gate of a NMOS transistor 2058. The source of the NMOS transistor 2058 is connected to the source of the PMOS transistor 2051 and to the drain of the PMOS transistor 2055. The drain of the NMOS transistor 2058 is connected to Vddl, which is at a voltage lower than Vdd and for purposes of easy understanding, it is expressed as Vdd–Vmargin.

In an output enabled mode, a voltage Vdd is applied to the gate of the PMOS transistor 2051 via the output enable terminal 2052 to turn off the PMOS transistor 2051. A complement signal 0.0 V is applied to the gate of the PMOS transistor 2053 via the complement output enable terminal 2054 to turn on the PMOS transistor 2053. As such, Vdd is output to wire NGATEX via the PMOS transistor 2053.

In an output disabled mode where the voltage at the pad 2056 Vpad is greater than Vdd, a 0.0 V signal is applied to the gate of the PMOS transistor 2051 via the output enable pad 2052 to turn on the PMOS transistor 2051. A complement signal Vdd is applied to the gate of the PMOS transistor 2053 via the complement output enable terminal 2054 to turn off the PMOS transistor 2053. Since Vpad is greater than Vdd, the PMOS transistor 2055 is turned off, and the PMOS transistor 2057 is turned on. Vpad is applied to the gate of the NMOS transistor 2058 to turn it on. Vddl, i.e., Vdd–Vmargin, is output to wire NGATEX via the NMOS transistor 2058 and the PMOS transistor 2051.

Figure 4:
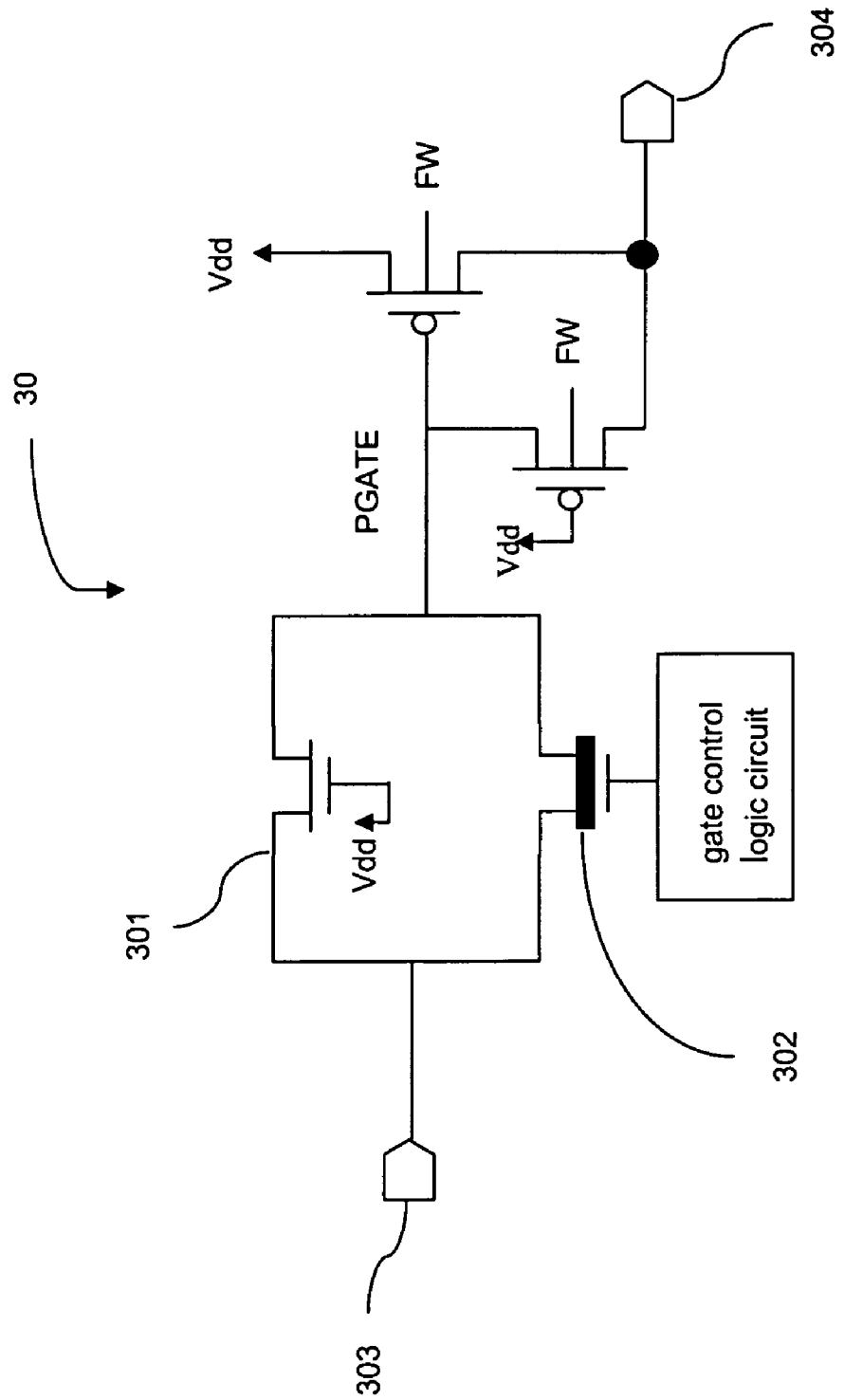
FIG. 4 schematically illustrates a switch module of a high voltage tolerant I/O circuit according to one embodiment of the present invention.

FIG. 4 illustrates a switch module 30 of a high voltage tolerant I/O circuit according to another embodiment of the invention. The structure of the switch module 30 is similar to the switch module 20 as shown in FIG. 2, except that the circuit 30 includes a NMOS transistor 301 connected to a native device 302 in a drain-to-drain and source-to-source manner. The gate of the NMOS transistor 301 is constantly connected to Vdd.

In an output enabled mode, the NMOS transistor 301 is turned on, so that it shares the signal loading with the native device 302 to pass an input signal having a voltage Vdd from a first terminal 303 to a pad 304. This helps to keep the size of the native device 302 small. As such, it alleviates issues of junction leakage in the native device 302.

Figure 5:
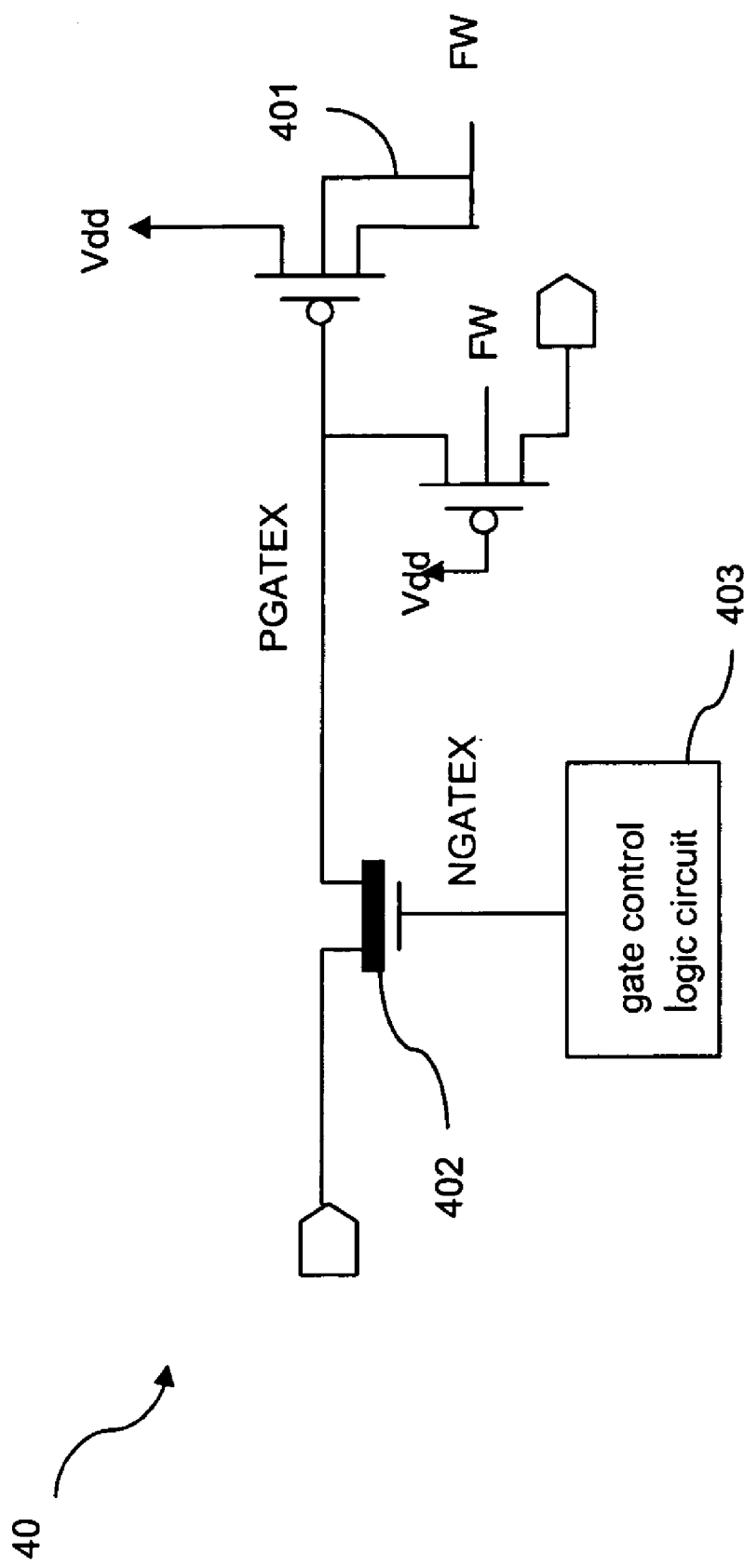
FIG. 5 schematically illustrates a switch module of a high voltage tolerant I/O circuit according to another embodiment of the present invention.

FIG. 5 illustrates a switch module 40 used to control a PMOS transistor having a floating N well, according to one embodiment of the present invention. The structure of the switch module 40 is similar to the switch module 20 as shown in FIG. 2, except that the drain and N well of a PMOS transistor 401 are floating. A native device 402 and GCL circuit 403 are used for controlling the PMOS transistor 401 in the same way as the native device 203 and the GCL circuit 205 do as shown in FIG. 2.

Figure 6:
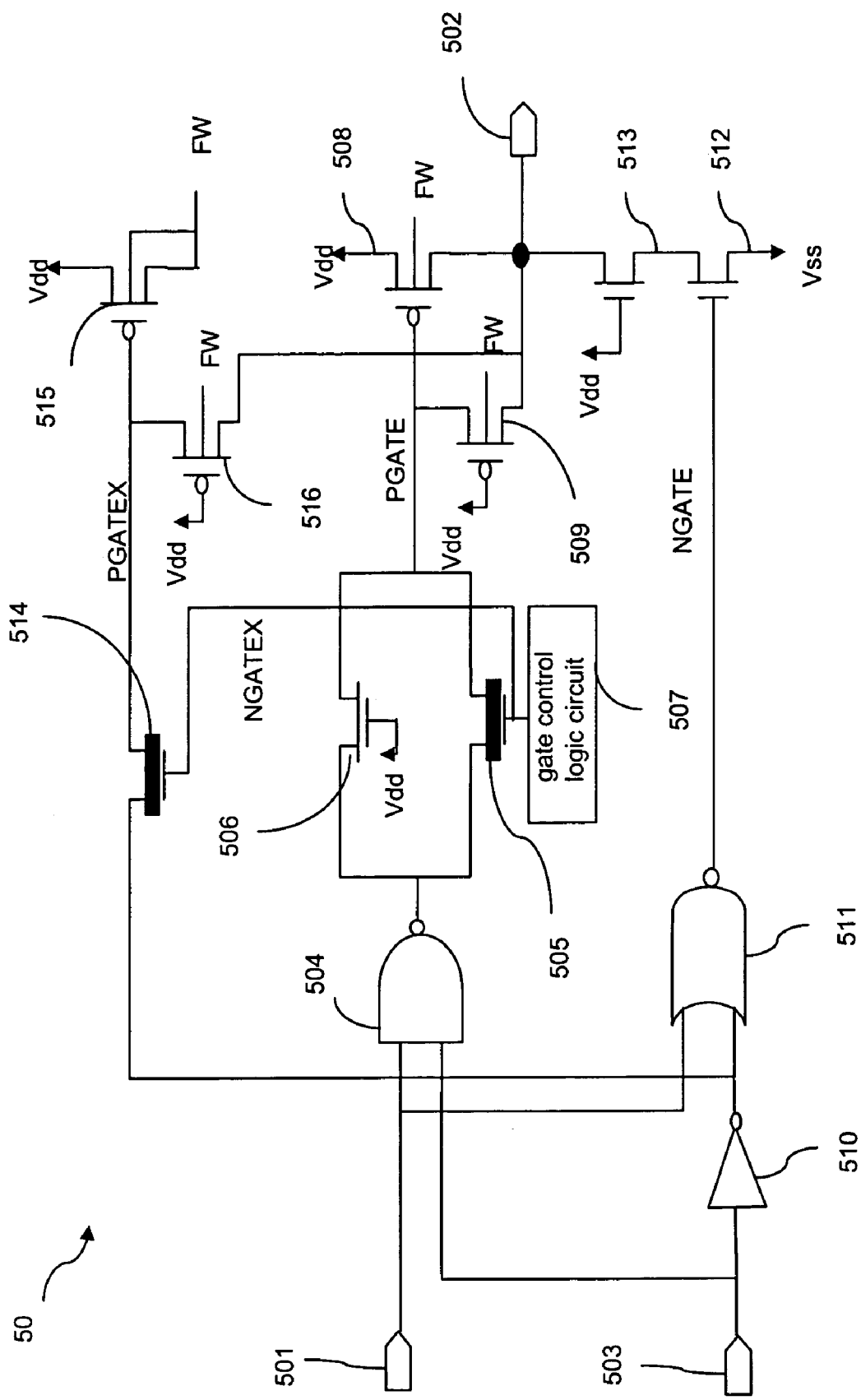
FIG. 6 schematically illustrates a high voltage tolerant I/O circuit according to another embodiment of the present invention.

FIG. 6 illustrates a more comprehensive high voltage tolerant I/O circuit 50 incorporating a switch module, according to one embodiment of the present invention. A data input terminal 501 connects the high voltage tolerant I/O circuit 50 to a low voltage circuit (not shown in this figure), that operates at a voltage level of Vdd. A pad 502 connects the high voltage tolerant I/O circuit 50 to a high voltage circuit (not shown in this figure) that operates at a voltage level of Vpad, where Vpad is greater than Vdd. An output enable signal is sent into the high voltage tolerant I/O circuit 50 via an output enable terminal 503 for placing the high voltage tolerant I/O circuit 50 among the three states, that is 1) asserting a low voltage logic "1" to the pad 102; 2) asserting a logic "0" to the pad 102; and 3) asserting neither logic "1" nor "0." The first two modes are denoted as the output enabled mode. The third state is denoted as the output disabled mode.

A NAND gate 504 connects the data input terminal 501 and the output enable terminal 503 to a native device 505 and a NMOS transistor 506. A GCL circuit 507 is connected to the gate of the native device 505. The native device 505 and NMOS transistor 506 are connected to PMOS transistors 508 and 509, which are further connected to the pad 502. The arrangement of those devices are similar to the high voltage tolerant I/O circuit as shown in FIG. 4.

The output enable terminal 503 is connected to an inverter 510. A NOR gate 511 connects the data input terminal 501 and the inverter 510 to a NMOS transistor 512, that is further connected to the pad 502 via a NMOS transistor 513. A native device 514 connects the inverter 510 to a PMOS transistor 515 whose drain and N well are floating. A PMOS transistor 516 connects the native device 514 and the PMOS transistor 515 to the pad 502. The arrangements of those devices are similar to the high voltage tolerant I/O circuit as shown in FIG. 5.

In an output enabled mode, an output enable signal representing a logic "1" is input via the output enable terminal 503 into the high voltage tolerant I/O circuit 50. The inverter 510 inverts the output enable signal from "1" to "0." When a logic "1" is input from the data input terminal 501, the signal on wire NGATE will be "0" and the NMOS transistor 512 will be turned off. In the mean time, the signal output from the NAND gate will be "0." In such mode, the GCL circuit 507 outputs Vdd to turn on the native device 505. As a result, the PMOS transistor 508 is turned on, and a logic "1" will be output from the pad 502.

When a logic "0" is input from the data input terminal 501, the NAND gate 504 will output a logic "1" that is further coupled to wire PGATE to turn off the PMOS transistor 115. In the mean time, the NOR gate receives a logic "0" from the data input terminal 501 and a logic "0" from the inverter 510. The voltage on wire NGATE will be a logic "1" and the NMOS transistor 512 will be turned on. Since the NMOS transistor 513 is always turned on, a logic "0" will be output from ground to the pad 502. As discussed above, because the native device 505 has a 0 V threshold voltage, the PMOS transistor 508 will be turned off immediately. Thus, the performance of the high voltage tolerant I/O circuit 50 is improved.

In an output disabled mode, an output disable signal representing a logic "0" is input via the output enable terminal 503 into the high voltage tolerant I/O circuit 50. The inverter 510 inverts the output enable signal from "0" to "1." The signal on wire NGATE will always be "0", no matter whether a logic "1" or "0" is input from the data input terminal 501, so that the NMOS transistor 512 is always turned off.

In such mode, GCL circuit 507 applies Vdd–Vmargin to the gate of the native device 505. Because the output disable signal representing a logic "0", the NAND gate 504 will always outputs a logic "1", no matter whether a logic "1" or "0" is input from the data input terminal 501. As mentioned above, the data input terminal 501 is connected to a low voltage circuit that operates at a voltage level of Vdd. The signal output from the NAND gate 504 would be Vdd as well. When the high voltage circuit that is connected to the pad 502 operates at Vpad, the PMOS transistor 509 is turned on and the voltage level on wire PGATE is raised to Vpad. In this case, the NMOS transistor 506 is turned off because the voltage difference between its gate and its source is zero, which is smaller than its threshold voltage. The native device 505 is also turned off because the voltage difference between its gate and its source is –Vmargin, which is smaller than 0.0 V, the threshold voltage of the native device 505. As such, there would be no leakage of current from wire PGATE to the NAND gate 504.

As discussed above, the native device 514 works in a similar way as the native device 505 in terms of controlling the PMOS transistor 515 and preventing leakage of current between wire PGATEX and the inverter 510.

The disclosed high voltage tolerant I/O circuit has an advantage of a faster switching speed from state to state. This allows the I/O circuit to operate at a faster clock frequency than the conventional art. The I/O circuit is also capable of preventing a leakage of current when it operates in a disabled mode. The native devices are free of additional manufacturing costs when using a semiconductor technology beyond the 0.18 µm process.

The above illustration provides many different embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A switch module interfacing between a low voltage circuit and a high voltage circuit, the switch module comprising:
    a switching device for providing an output signal to the high voltage circuit in response to a data input signal received from the low voltage circuit;
    a native device coupled between the switching device and the data input signal for passing the data input signal to control an on or off state of the switching device; and
    a gate control logic circuit capable of operating in an output disabled mode and an output enabled mode in response to an output enable signal provided to the switch module,
    wherein, in the output disabled mode, the gate control logic circuit disables the native device for preventing a leakage current passing therethrough,
    wherein, in the output enabled mode, the gate control logic circuit enables the native device to pass the data input signal through without a substantial voltagedrop, thereby enhancing a switching speed of the switching device.

2. The switch module of claim 1 wherein the native device is a native NMOS transistor having a zero threshold voltage.

3. The switch module of claim 2 wherein the native NMOS transistor has a gate controlled by the gate control logic circuit.

4. The switch module of claim 3 wherein when the gate control logic circuit operates at an output enabled mode, the gate control logic circuit applies a voltage to the gate of the native NMOS transistor no smaller than that of the data input signal.

5. The switch module of claim 3 wherein when the gate control logic circuit operates at an output disabled mode, the gate control logic circuit applies a voltage to the gate of the native NMOS transistor smaller than that of the data input signal.

6. The switch module of claim 2 further comprising a NMOS transistor connected to the native NMOS transistor in a source-to-source and drain-to-drain manner.

7. The switch module of claim 1 wherein the switching device is a PMOS transistor.

8. The switch module of claim 7 wherein the source of the PMOS transistor is connected to a positive power supply and the drain of the PMOS provides the output signal.

9. The switch module of claim 7 wherein the source of the PMOS transistor is connected to a positive power supply, and the drain and the well of the PMOS transistor are floating.

10. A high voltage tolerant I/O circuit interfacing between a low voltage circuit and a high voltage circuit, the high voltage tolerant I/O circuit comprising:
    a switching device for providing an output signal to the high voltage circuit in response to a data input signal received from the low voltage circuit;
    a first native NMOS transistor, having a zero threshold voltage, coupled between the switching device and the data input signal for passing the data input signal to control an on or off state of the switching device; and
    a gate control logic circuit capable of operating at an output disabled mode and an output enabled mode in response to an output enable signal provided to the I/O circuit,
    wherein, in the output disabled mode, the gate control logic circuit applies a voltage to a gate of the first native NMOS transistor smaller than that of the data input signal for preventing a leakage current passing therethrough, wherein, in the output enabled mode, the gate control logic circuit applies a voltage to the gate of the first native NMOS transistor no smaller than that of the data input signal, thereby enhancing a switching speed of the switching device.

11. The I/O circuit of claim 10 wherein the gate of the first native NMOS transistor is controlled by the gate control logic circuit.

12. The I/O circuit of claim 10 further comprising a first NMOS transistor connected to the first native NMOS transistor in a source-to-source and drain-to-drain manner.

13. The I/O circuit of claim 10 wherein the switching device is a PMOS transistor.

14. The I/O circuit of claim 13 wherein the source of the PMOS transistor is connected to a positive power supply and the drain of the PMOS transistor provides the output signal.

15. The I/O circuit of claim 13 wherein the source of the PMOS transistor is connected to a positive power supply, and the drain and the well of the PMOS transistor are floating.

16. The I/O circuit of claim 10 further comprising an output enable terminal from which an output enabled signal is input for placing the I/O circuit in the output enabled mode or the output disabled mode.

17. A high voltage tolerant I/O circuit interfacing between a low voltage circuit and a high voltage circuit, the high voltage tolerant I/O circuit comprising:

a switching device connected to the high voltage circuit via at least a pad for switching between an on state and an off state in response to a data input signal having a first voltage received from a data input terminal;

a native NMOS transistor with a zero threshold voltage, having a gate, a first electrode connected to the data input terminal and second electrode connected to the switching device, for passing the data input signal through the first electrode and the second electrode to the switching device;

a gate control logic circuit capable of operating at an output disabled mode and an output enabled mode in response to an output enable signal provided to the I/O circuit, wherein, in the output disabled mode, the gate control logic circuit applies a voltage to a gate of the native NMOS transistor smaller than that of the data input input signal for preventing a leakage current passing therethrough, wherein, in the output enabled mode, the gate control logic circuit applies a voltage to the gate of the native NMOS transistor no smaller than that of the data input signal, thereby enhancing a switching speed of the switching device.

18. The I/O circuit of claim 17 further comprising a NMOS transistor connected to the native NMOS transistor in a source-to-source and drain-to-drain manner.

19. The I/O circuit of claim 17 wherein the switching device is a PMOS transistor.

20. The I/O circuit of claim 19 wherein the source of the PMOS transistor is connected to a positive power supply and the drain of the PMOS transistor is connected to the pad.

21. The I/O circuit of claim 19 wherein the source of the PMOS transistor is connected to a power source, and the drain and the well of the PMOS transistor are floating.

* * * * *

UNITED STATES PATENT AND TRADEMARK OFFICE
CERTIFICATE OF CORRECTION

PATENT NO. : 7,113,018 B2 Page 1 of 1
APPLICATION NO. : 10/978019
DATED : September 26, 2006
INVENTOR(S) : Kuo-Tsai Li and Chi-Chiang Lin It is certified that error appears in the above-identified patent and that said Letters Patent is hereby corrected as shown below:

Column 8, line 21, delete "voltagedrop" and insert therefor -- voltage drop --.

Signed and Sealed this

Seventeenth Day of July, 2007

JON W. DUDAS
*Director of the United States Patent and Trademark Office*